(12) United States Patent
Caletka et al.

(10) Patent No.: US 6,905,961 B2
(45) Date of Patent: Jun. 14, 2005

(54) LAND GRID ARRAY STIFFENER FOR USE WITH FLEXIBLE CHIP CARRIERS

(75) Inventors: David Vincent Caletka, Apalachin, NY (US); Krishna Darbha, Johnson City, NY (US); William Infantolino, Vestal, NY (US); Eric Arthur Johnson, Greene, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/336,579

(22) Filed: Jan. 3, 2003

(65) Prior Publication Data

US 2003/0090000 A1 May 15, 2003

Related U.S. Application Data

(62) Division of application No. 09/874,196, filed on Jun. 5, 2001, now Pat. No. 6,528,892.

(51) Int. Cl.[7] .............................................. H01L 21/44
(52) U.S. Cl. ..................... 438/667; 438/637; 438/638; 438/639
(58) Field of Search .......................... 438/667, 637–639

(56) References Cited

U.S. PATENT DOCUMENTS

| | | | |
|---|---|---|---|
| 5,394,009 A | 2/1995 | Loo | 257/666 |
| 5,467,253 A | 11/1995 | Heckman et al. | 361/761 |
| 5,493,237 A | 2/1996 | Volz et al. | 324/754 |
| 5,586,006 A | 12/1996 | Seyama et al. | 361/719 |
| 5,648,893 A | 7/1997 | Loo et al. | 361/820 |
| 5,722,160 A | 3/1998 | Uemura et al. | 29/840 |
| 5,806,181 A | 9/1998 | Khandros et al. | 29/874 |
| 5,818,699 A | 10/1998 | Fukuoka | 361/760 |
| 5,841,194 A | 11/1998 | Tsukamoto | 257/729 |
| 5,940,966 A | 8/1999 | Fasano et al. | 29/842 |
| 5,991,161 A | 11/1999 | Samaras et al. | 361/76 |
| 6,002,168 A | 12/1999 | Bellaar et al. | 257/696 |
| 6,014,317 A | 1/2000 | Sylvester | 361/760 |
| 6,037,044 A | 3/2000 | Giri et al. | 428/209 |
| 6,057,175 A | 5/2000 | Milla et al. | 438/113 |
| 6,075,710 A | 6/2000 | Lau | 361/760 |
| 6,097,611 A | 8/2000 | Samaras et al. | 398/669 |
| 6,406,942 B2 * | 6/2002 | Honda | 438/119 |

* cited by examiner

*Primary Examiner*—Luan Thai
(74) *Attorney, Agent, or Firm*—John A. Jordan; William H. Steinberg

(57) ABSTRACT

A flexible chip carrier with contact pads on its upper surface matching those of the chip with said pads conductively connected to land grid array (LGA) pads on its lower surface matching the those of a card or PCB. The chip carrier is provided with a stiffening layer at the LGA interface. The stiffening layer is mechanically attached to the lower surface of the chip carrier. Holes are formed in the stiffening layer to expose the LGA pads. The holes are then filled with a conductive adhesive material. Compliant LGA bumps are applied to the uncured conductive adhesive material which material is then cured.

16 Claims, 3 Drawing Sheets

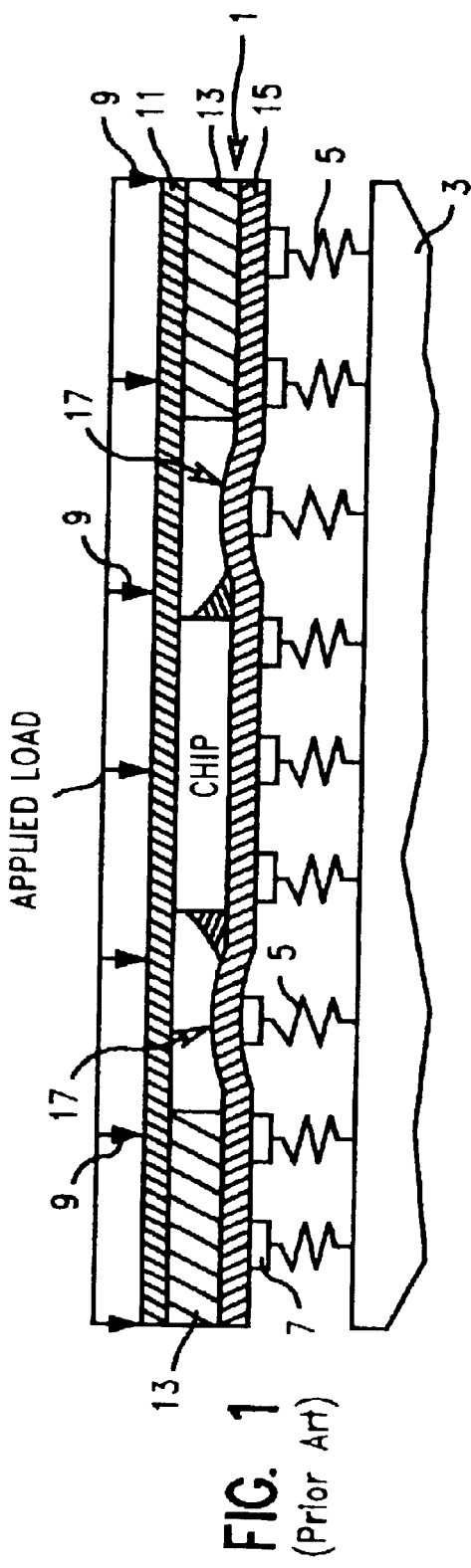
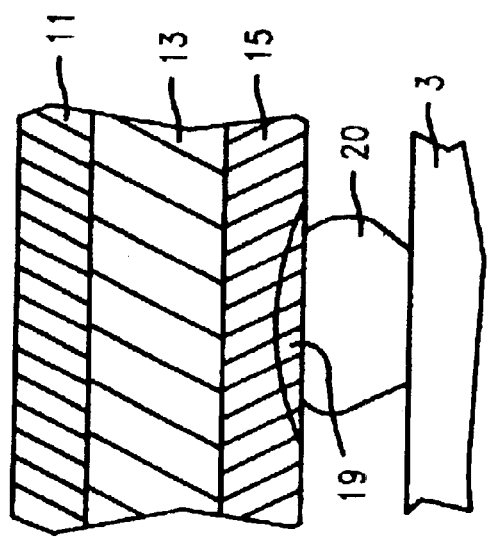
FIG. 1 (Prior Art)
FIG. 2 (Prior Art)

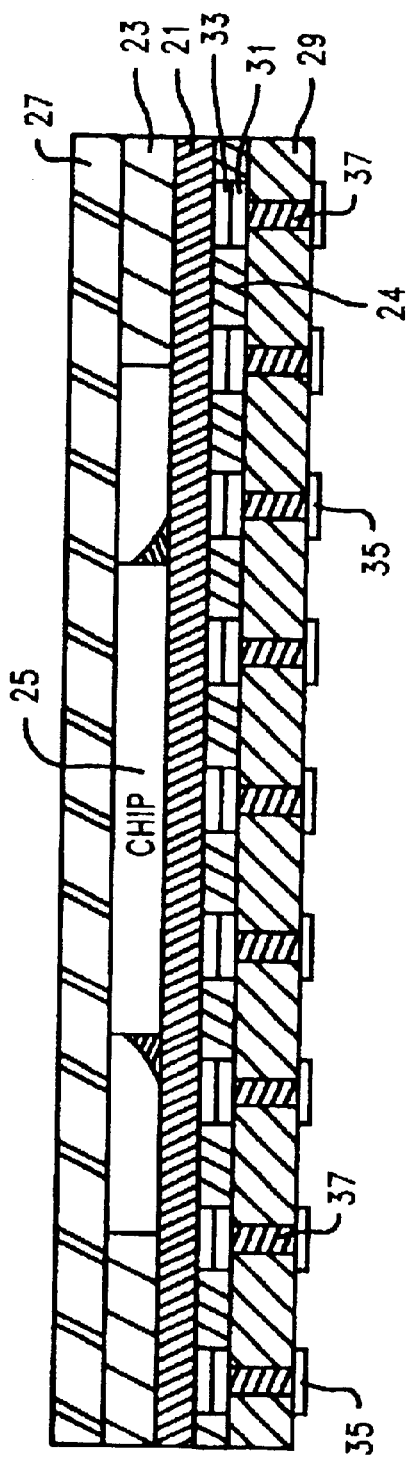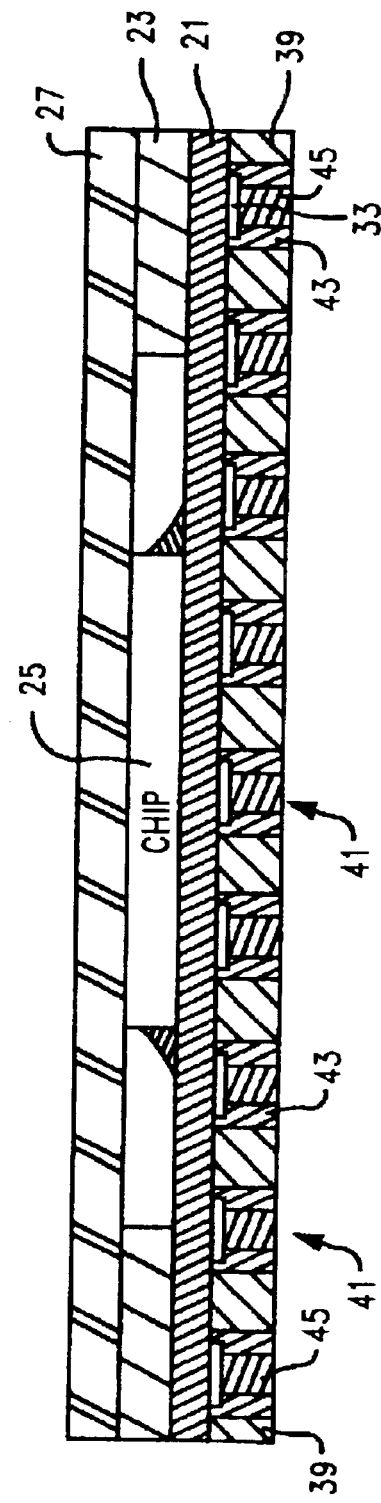

LAND GRID ARRAY STIFFENER FOR USE WITH FLEXIBLE CHIP CARRIERS

The present application is a divisional application of a U.S. patent application Ser. No. 09/874,196, filed Jun. 5, 2001, now U.S. Pat. No. 6,528,892.

BACKGROUND OF THE INVENTION

1. Field of the Invention

The present invention relates to electronic packaging. More particularly, the present invention relates to electronic packaging using flexible flip chip carriers with land grid array attachment arrangements for stiffening same.

2. Background and Related Art

There exists in the prior art a variety of ways of connecting integrated circuit chips to printed circuit boards (PCBs). One prior art approach is to connect the integrated circuit chip directly to the laminate PCB. However, one of the difficulties with such connections arises from the large difference in thermal coefficient of expansion (TCE) between the silicon chip and the PCB. This difference creates problems affecting reliability over a large number of thermal cycles. One approach to addressing the problems caused by differences in TCE between chip and PCB is to use some form of intermediate chip carrier. Such carriers offer several advantages including the fact that they may be either single chip carriers or multichip carriers. Typically, they are made of plastic, ceramic or flexible tape-like material. However, chip carriers made of plastic, ceramic or flexible material also have limitations in regard to overall reliability, cost and ease of assembly. Intermediate structures known as interposers, are also employed in a variety of design configurations to connect chips or chip carriers to laminate cards or PCBs. Typically, these interposers are designed to offer some additional form of compliance or flexibility in connecting chips or chip carriers to cards or PCBs so as to avoid stress, fracturing and the like caused by differences in TCE between chip or chip carrier and card or PCB.

Many advances are being made in organic packaging materials, such as, polytetrofluoroethylene (PTFE) based materials. Such materials, when used as flexible chip carriers, offer a low dielectric constant that improves electrical performance beyond that which is possible with standard FR-4 laminates, for example. Such materials also make possible improvements in wiring density. As chip density and machine speeds increase, advanced laminate materials for chip carriers become more important. In addition to reliance upon material advances, use of improved interconnect technologies, such as land grid array (LGA) interconnects, become more important.

The LGA interconnects rely on good surface contact between mating pads for reliable electrical connection. Accordingly, a constant and uniform compressive force must be maintained between the mating pads throughout the life of the electronic device in order to maintain reliable electrical interconnection. In addition, air must be excluded to prevent oxidation of the contact surfaces where noble metals are not used.

A primary requirement for LGA connectors is rigidity of the mating arrays. Thin packages, such as tape ball grid array (TBGA)-type packages and ones that use materials with low elastic moduli, such as PTFE or unfilled build-up layers, must have stiffeners attached in order to prevent excessive bending. Typical of such arrangements is the peripheral stiffener described by Tsukamoto in U.S. Pat. No. 5,841,194. However, even with peripheral stiffeners, force is transmitted through the package and produces a small amount of localized bending in the chip carrier substrate.

In addition to localized bending, plastic flow of the dielectric materials, especially when a laminate such as PTFE is used, occurs over time with an applied load, particularly at elevated temperatures. This acts to increase deformation. The compressive load on an LGA connection can cause relaxation of the laminate and a decrease in the contact force between mating pads over time thereby leading to intermittent or constant "open" connections.

Another problem that arises from this localized bending or deformation is the fracture of circuit lines or cracking of solder masks. Such fracture or cracking occurs because neither of these structures can deform plastically to the same degree as PTFE or an unfilled polymer, for example, can deform.

SUMMARY OF THE PRESENT INVENTION

Accordingly, it is an object of the present invention to provide an improved electronic package and method of making same.

It is a further object of the present invention to provide improved LGA connections between chip carrier and carrier substrate to thereby increase reliability.

It is yet a further object of the present invention to provide an improved chip carrier structure that allows maintaining a constant and uniform contact force between mating pads of an LGA connection.

It is still yet a further object of the present invention to provide an improved chip carrier structure and method of making same for use in LGA connection between chip and card or PBC, which structure restricts localized bending and plastic flow.

It is another object of the present invention to provide an LGA stiffener for use with a flexible chip carrier, and method for making same.

It is yet another object of the present invention to provide a thin compliant chip carrier with stiffeners arranged to prevent excessive localized bending and plastic flow so as to maintain a constant and uniform compressive force between mating pads in an LGA-type connection.

In accordance with the present invention, a thin, compliant chip carrier structure, such as PTFE-based structures, is provided with pads at one surface, matching the pads of a flip-chip, and LGA pads at the other surface, matching the LGA pads of a relatively rigid mating card or PBC. The compliant chip carrier is provided with various forms of LGA stiffeners and methods for making same. The stiffeners act to prevent excessive localized bending and plastic flow in the chip carrier that cause fractures, warping and cracking in circuit lines and connection interfaces. The stiffeners are such as to readily accommodate compliant LGA conductors or bumps.

These foregoing and other objects, features and advantages of the invention will be apparent from the following more particular description of a preferred embodiment of the invention, as illustrated in the accompanying drawings, wherein like reference members represent like parts of the invention.

BRIEF DESCRIPTION OF THE DRAWING

FIG. 1 shows a cross-section of a representative prior art flexible laminate chip carrier which exhibits localized bending.

FIG. 2 shows a cross-section of a portion of the representative prior art flexible laminate chip carrier of FIG. 1 which Figure exhibits further localized bending due to plastic flow.

FIG. 3 shows a cross-section of one form of the stiffened laminate chip carrier, in accordance with the present invention.

FIG. 4 shows a cross-section of another form of the stiffened laminate chip carrier, in accordance with the present invention.

DETAILED DESCRIPTION

Figure 5:
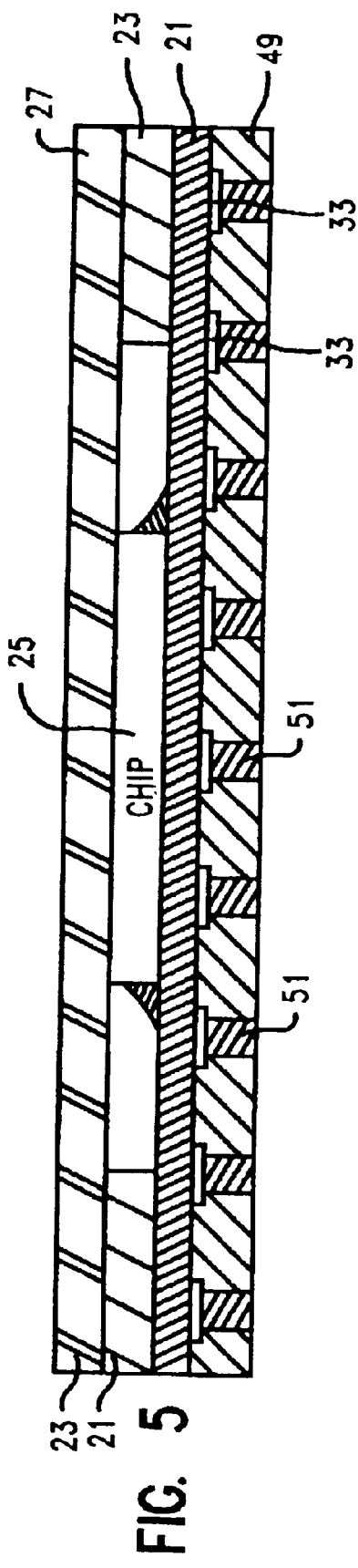
FIG. 5 shows a cross-section of yet another form of the stiffened laminate chip carrier, in accordance with the present invention.

With reference to FIG. 1, there is shown a cross-section of a typical prior art flexible LGA packaging structure. Thin packaging structures, such as, tape ball grid array (TBGA)-like packages and those that employ materials with low elastic moduli (such as PTFE or unfilled build-up layers) typically require peripheral stiffeners in order to prevent excessive bending. However, even with these peripheral stiffeners, force is transmitted through the package and localized bending still occurs. FIG. 1 depicts how such bending occurs. The Figure shows an LGA connection between chip carrier 1 and rigid mating card 3 wherein the LGA interposer comprising compliant conductor connections to the card are idealized as springs 5 and contacts 7. FIG. 2 shows a typical compliant conductor 20 acting as a conductive interposer between pads (not shown) on contact mating card 3 and flexible chip carrier substrate 15. Mating card 3 is also idealized as a rigid surface.

Again, with reference to FIG. 1, when a force (represented by arrows 9) is applied to the top of the package, neither cap 11 nor peripheral stiffener 13 bend significantly. However, the reaction force applied by the compliant interposer (represented by springs 5) on flexible chip carrier substrate 15 can cause localized bending, as shown at 17.

In addition to bending, plastic flow of the dielectric materials used for the chip carrier substrate may occur over time with an applied load, particularly at elevated temperatures, thereby increasing deformation. This is particularly so when PTFE, for example, is used for the chip carrier. This can be seen more clearly by reference to FIG. 2 wherein the visco-elastic/plastic chip carrier material 15 beneath peripheral stiffener 13 becomes locally deformed causing dielectric extrusion in region 19 in response to the reaction force of compliant conductor 20 and its mating pad (not shown) on card 3.

Thus, the compressive load on an LGA connection can cause relaxation of laminate chip carrier 15 and a decrease in the contact force on the pads over some period thereby leading to intermittent or permanent disconnects or "opens" at the mating contacts. In addition, the localized bending or deformation can cause fractures in the circuit lines or cracking of solder masks (not shown) since neither of these structures can deform plastically to the same degree as PTFE or an unfilled polymer, for example.

Since machine reliability requires that a constant and uniform compressive force be applied and maintained between mating pads of an LGA connection throughout the life of its operation, excessive localized bending and deformation must be avoided. In accordance with the present invention, various structures are employed so as to avoid excessive bending and deformation of organic chip carriers and the attendant problems.

FIG. 3 shows a cross-section of one structural arrangement for stiffening a low stiffness laminate chip carrier, in accordance with the present invention. Low stiffness laminate chip carrier 21 may, for example, be PTFE. Peripheral stiffener 23 surrounds chip 25, each of which is both bonded to chip carrier 21 and covered by cap 27. Attached to the bottom of chip carrier 21 is an areal stiffener layer 29, which may be made of a relatively rigid insulating material, such as laminated PCB made from materials such as glass reinforced epoxy circuit board material (FR4). Stiffener 29 is provided with LGA pads 31, each of which mate with LGA pads 33 on chip carrier 21 and electrically connect to pads 35 through conductive vias 37. Pads 35 may also be compliant conductive bumps conductively connected to pads 31. Stiffener 29 is mechanically attached to chip carrier 21 to effectively reduce local deformation. Best results are achieved by attaching stiffener 29 to chip carrier 21 using a non-conductive adhesive 24 covering its surface.

Accordingly, attachment may be carried out by first coating either chip carrier 21 or stiffener 29 with a first, non-conductive adhesive 24. The pads on either member are then coated with a second, conductive adhesive (not shown). The members are then pressed together and the adhesive is cured. Alternatively, either or both adhesives may be partially cured before assembly. The first adhesive may be a partially-cured, dry-film with clearance holes provided for pads 33. A solder may be used as an alternative to the conductive adhesive. These steps may be undertaken either before or after chip attach, peripheral stiffener attach, underfill, and the like.

The arrangement in FIG. 3 may also be assembled using other stiffeners. For example, a metal sheet with resin-filled clearance holes around its vias and pads may be used. In addition, a layer of epoxy, ceramic or cermet may also be used. Other relatively stiff materials which, when mechanically coupled to the chip carrier reduce local deformation, may, likewise, be used.

As an alternative to the above, the arrangement shown in FIG. 3 may also be fabricated without preforming conductive vias 37 and pads 31 and 35. This may be done by creating an array of holes in stiffener 29, so that the positions of the array of holes match the positions of the array of pads 33 on flexible chip carrier 21. The holes in the stiffener are then aligned with the pads on the chip carrier. The stiffener is attached to chip carrier 21 by a non-conductive adhesive. By applying a sufficient amount of non-conductive adhesive, the adhesive may be made to extrude out through the holes during lamination. Electrical connections can subsequently be made by drilling, either mechanically or by laser ablation, through the adhesive-filled holes. This process virtually eliminates voids between the stiffener and chip carrier.

FIG. 4 shows the cross-section of a further structural arrangement for stiffening a low stiffness laminate chip carrier, in accordance with the present invention. In this arrangement, holes are initially formed in stiffener 39, as shown at 41, which are larger than LGA pads 33 on low-stiffness chip carrier 21. Stiffener 39 may be any of the variety of stiffeners suggested in the description of the arrangement of FIG. 3. Since the holes are larger than pads 33 thereby providing a degree of clearance around the pads, a metal stiffener could readily be employed here. Similar to that described above with regard to FIG. 3, stiffener 39 is adhered to chip carrier 21 with a non-conductive adhesive, which is not shown at the interface but is shown in cross-hatch as sidewalls 43 in the holes. In this regard, the adhesive is applied in a manner so as to extrude into the holes during lamination to eliminate voids. Laser ablation or mechanical drilling is then used to open holes in the non-conductive adhesive to reach pads 33. The holes are formed so that walls 43 of non-conductive adhesive remain after drilling. Solder or a conductive paste is then used to form LGA pads 45. If a metal stiffener is used, it may be grounded in order to enhance electrical performance.

FIG. 5 shows the cross-section of another structural arrangement for stiffening the flexible laminate chip carrier, in accordance with the present invention. In this arrangement, a non-conductive highly-filled plastic 49 is transfer-molded directly onto flexible chip carrier 21 thereby eliminating the need for a separate adhesive step and thus simplifying the assembly process. In this process, it is necessary to mold the stiffener onto chip carrier 21 before chip 25 or peripheral stiffener 23 are attached since the high pressure required for molding could otherwise deform or damage flexible chip carrier 21. If holes are not molded through the stiffener 49 to thereby expose pads 33, the holes may be drilled into the stiffener by laser ablation or by mechanical means to thus expose pads 33. The holes are then filled with solder or conductive adhesive to form LGA conductor pads 51.

As an alternative to the above assembly process, a solder or conductive adhesive may first be applied to form LGA conductor pads 51 over pads 33 on chip carrier 21 before molding. Where a conductive adhesive is used, it must first be cured before proceeding. Here, the LGA conductors 51 may structurally be more like a bump. A stiffener 49 is then transfer molded onto chip carrier 21. Grinding, laser ablation or etching may then be used to remove plastic mold material over the bumps to thereby expose the solder or conductive adhesive material. Alternatively, the surface of the mold parallel to the plane of chip carrier 21 may be covered with a compliant material (such as a synthetic rubber like EPDM) so that it is in contact with the lower surface of the solder or adhesive bumps. The compliance of the mold surface then prevents the mold material from covering the surface of the solder or adhesive bumps. If necessary, grinding, for example, may be used to clean any residual mold material from the bumps.

Figure 6:
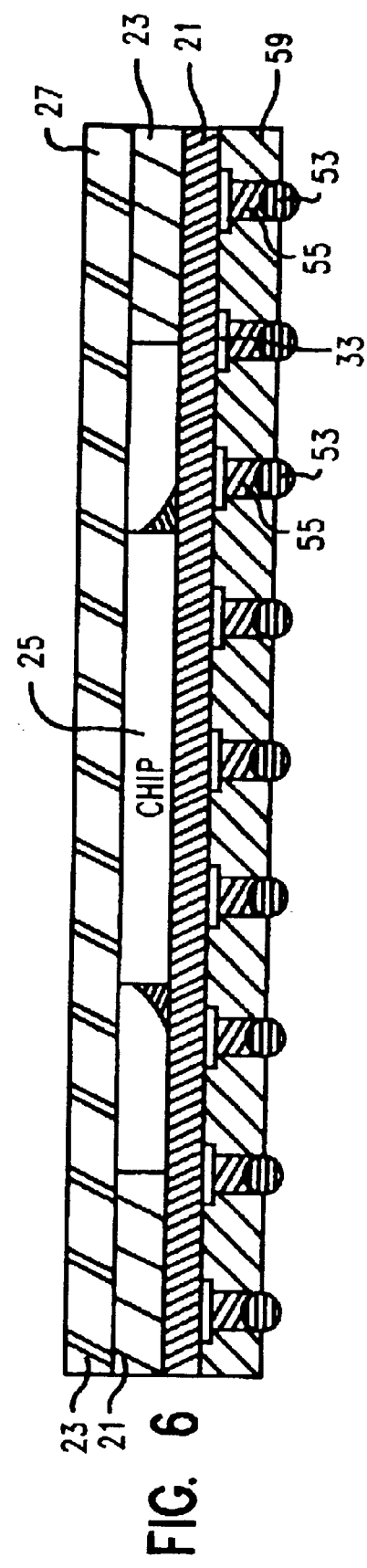
FIG. 6 shows a cross-section of the laminate chip carrier of the present invention using compliant BGA pads or bumps for connection to a stiff card or PBC.

FIG. 6 shows the laminate chip carrier with further improved stiffness, in accordance with the present invention, where compliant LGA conductors or bumps 53 are attached. In accordance with the arrangement of FIG. 6, attachment of compliant conductors 53 may be carried out in any of the arrangements described above by utilizing the exposure of pads 33 on chip carrier 21. In FIG. 3, because holes are preformed, exposure occurs when stiffener 29 is attached to chip carrier 21. In FIGS. 4 and 5, exposure occurs after laser ablation or drilling holes through attached stiffener 29.

After exposing pads 33, the holes are filled through stiffener 59 with conductive adhesive 55, as shown in FIG. 6. In this regard, the conductive adhesive material acts to adhere to the walls of the holes so as to offer resistance to the reaction force of the compliant LGA conductors. It is clear that other forms of conductive materials which are in good frictional contact with the walls of the holes could, likewise, be used. After filling the holes, compliant LGA conductors or bumps 53 are then applied to the uncured conductive adhesive, which is subsequently cured. It is noted that although compliant LGA conductors are shown in FIG. 6 as being spherical, it is clear that these conductors could take any of a variety of shapes so long as they protrude in a relatively uniform manner from the lower surface of stiffener 59.

In an alternative configuration, the walls of the holes may be tapered outwardly, beginning at the lower surface of stiffener 59 and expanding outwardly as the holes extend upwardly toward pads 33. The holes may then be filled with a compliant conductive material to contact pads 33, whereby the tapered holes act to provide a degree of resistance to the force exerted by the compliant material upon pads 33. Other hole shapes and design configurations could likewise be employed to provide resistance to the force exerted by the compliant conductive material upon pads 33.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of stiffening the land grid array connection structure of a flexible chip carrier, comprising the steps of:
   providing a layer of flexible dielectric material having a chip site on one surface thereof and having an array of land grid array contacts on the other surface thereof with each contact arranged so as to be aligned for conductive contact with respective ones of an array of land grid array contacts on a substrate for said chip carrier;
   providing a layer of stiffening material to attach to said layer of flexible dielectric material at said other surface thereof, said layer of stiffening material having an array of contacts on one surface thereof matching said array of land grid array contacts on the said other surface of said flexible dielectric material;
   providing openings in said layer of stiffening material to expose each contact of said array contacts on said one surface of said layer of stiffening material;
   filling said openings with conductive material to form conductors in conductive contact with said contacts of said array of contacts on said one surface of said layer of stiffening material; and
   attaching said layer of stiffening material with conductors to said layer of flexible dielectric material so that said array of contacts on said one surface of said stiffening material align with and are in contact with said land grid array of contacts on said other surface of said flexible dielectric material.

2. The method as set forth in claim 1 wherein said step of attaching said layer of stiffening material includes attaching with a non-conductive adhesive.

3. The method as set forth in claim 2 wherein said layer of stiffening material is selected from among metal, FR4, epoxy, ceramic and cermet materials.

4. The method as set forth in claim 1 wherein said step of filling said openings includes first filling said opening with an adhesive conductive material and then applying a compliant conductive material to said adhesive conductive material to form compliant land grid array conductors for connection to said substrate.

5. A method of stiffening the land grid array connection structure of a flexible chip carrier, comprising the steps of:
   providing a layer of flexible chip carrier material having a chip site on one surface thereof and having an array of land grid array contacts on the other surface thereof;

attaching a non-conductive highly-filled plastic layer of stiffening material directly onto said layer of flexible chip carrier material at said other surface thereof by transfer molding;

providing openings in said layer of stiffening material to expose each contact of said array of land array contacts on said other surface thereof of said layer of flexible chip carrier material; and filling said openings with conductiv material to form conductors in conductive contact with said contacts of said array of land grid array contacts on said other surface of said layer of flexible chip carrier material.

6. The method as set forth in claim 5 wherein said step of providing openings includes drilling said plastic layer to expose each of said contacts of said array land grid array contacts.

7. The method as set forth in claim 5 wherein said step of filling said openings includes first filling said opening with an adhesive conductive material and then applying a compliant conductive material to said adhesive conductive material to form compliant land grid array conductors.

8. A method of stiffening the land grid array connection structure of a flexible chip carrier, comprising the steps of:

providing a layer of flexible dielectric material having a chip site on one surface thereof and having an array of land grid array contacts on the other surface thereof with each contact arranged so as to be aligned for conductive contact with respective ones of an array of land grid array contacts on a substrate for said chip carrier;

drilling an array of openings in a layer of stiffening material matching in location the location of the contacts of said land grid array contacts on the said other surface of said layer of flexible dielectric material with each of said openings being larger than said contacts and with said dielectric material selected from among metal, FR4, epoxy, ceramic and cermet materials;

attaching with a non-conductive adhesive said layer of stiffening material to said layer of flexible dielectric material at said other surface thereof, said non-conductive adhesive being sufficient in amount to extrude into said openings to cover the walls of said openings; and filling said openings with conductive material to form conductors in conductive contact with said contacts of said array of land grid array contacts on said other surface of said layer of flexible dielectric material.

9. The method as set forth in claim 8 wherein said non-conductive adhesive extruded into said openings is partially removed by drilling so as to expose each contact of said array of land grid array of contacts and leave said walls covered with said non-conductive adhesive.

10. A method of stiffening the land grid array connection structure of a flexible chip carrier, comprising the steps of:

providing a layer of flexible dielectric material having a chip site on one surface thereof and having a plurality of land grid array contacts on the other surface thereof with each contact arranged so as to be aligned for conductive contact with respective ones of a land grid array of contacts on a substrate for said carrier;

attaching peripheral stiffening material to said one surface of said layer of flexible dielectric material around said chip site for stiffening said layer of flexible dielectric material;

attaching an areal layer of stiffening material to the said other surface of said layer of flexible dielectric material to provide areal stiffening support for said layer of flexible dielectric material, said stiffening material being a non-conductive highly-filled plastic layer attached by transfer molding directly onto said layer of flexible dielectric material;

forming openings in said areal layer of stiffening material that are aligned with and extended to each contact of said plurality of land grid array contacts on said other surface of said layer of flexible dielectric material; and forming in each of said openings through said areal layer of stiffening material a compliant land grid array conductor in conductive contact with respective contacts of said plurality of land grid array contacts on said layer of flexible dielectric material.

11. The method as set forth in claim 10 wherein said step of forming openings includes drilling said plastic layer to expose each of the contacts of said plurality of land grid array contacts.

12. The method as set forth in claim 10 wherein said step of forming in each of said openings includes first filling said opening with a conductive adhesive material and then applying a compliant conductive material to said conductive adhesive material to form compliant land grid array conductors for connection to said substrate.

13. A method of stiffening the land grid array connection structure of a flexible chip carrier, comprising the steps of:

providing a layer of flexible dielectric material having a chip site on one surface thereof and having a plurality of land grid array contacts on the other surface thereof with each contact arranged so as to be aligned for conductive contact with respective ones of a land grid array of contacts on a substrate for said carrier;

attaching peripheral stiffening material to said one surface of said layer of flexible dielectric material around said chip site for stiffening said layer of flexible dielectric material;

providing an areal layer of stiffening material;

forming openings in said areal layer of stiffening material that are located to align with and are larger than each of said plurality of land grid array contacts on said other surface of said layer of flexible dielectric material;

attaching said areal layer of stiffening material to the said other surface of said layer of flexible dielectric material so as to position said openings over said land grid array contacts and provide areal stiffening support for said layer of flexible dielectric material; and forming in each of said openings through said areal layer of stiffening material a compliant land grid array conductor in conductive contact with respective contacts of said plurality of land grid array contacts on said layer of flexible dielectric material.

14. The method as set forth in claim 13 wherein said step of forming openings in said areal layer of stiffening material includes the steps of lining said openings with a non-conductive adhesive by extruding said non-conductive adhesive into said openings during said step to attaching and then forming smaller opening in said non-conductive adhesive.

15. The method as set forth in claim 14 wherein said non-conductive adhesive extruded in said openings is partially removed by drilling so as to expose each of said contacts and leave said walls covered with said non-conductive adhesive.

16. The method as set forth in claim 13 wherein said step of forming in each of said openings includes first filling said opening with a conductive adhesive material and then applying a compliant conductive material to said conductive adhesive material to form compliant land grid array conductors for connection to a substrate.

* * * * *